United States Patent [19]

Van Der Beck et al.

[11] Patent Number: 5,298,084
[45] Date of Patent: Mar. 29, 1994

[54] ELECTRICAL INSULATOR ASSEMBLY WITH OXYGEN PERMEATION BARRIER

[75] Inventors: Roland R. Van Der Beck, Lansdale; James A. Bond, Exton, both of Pa.

[73] Assignee: The United States of America as represented by the United States Department of Energy, Washington, D.C.

[21] Appl. No.: 989,609

[22] Filed: Dec. 11, 1992

[51] Int. Cl.$^5$ .............................................. H01L 35/02
[52] U.S. Cl. ............................ 136/230; 136/234; 136/242
[58] Field of Search ............... 136/202, 230, 234, 237, 136/242; 429/247, 248, 5, 11, 50, 102, 103, 104, 112, 120

[56] References Cited

U.S. PATENT DOCUMENTS

| | | | |
|---|---|---|---|
| 3,091,554 | 5/1963 | Rosser et al. | 117/144 |
| 3,284,176 | 11/1966 | Reed et al. | 29/195 |
| 3,508,968 | 4/1970 | Ovshinsky | 136/83 |
| 4,175,164 | 11/1979 | Cole | 429/11 |
| 4,283,469 | 8/1981 | Goebel et al. | 429/196 |
| 4,802,929 | 2/1989 | Schock | 136/205 |
| 4,808,240 | 2/1989 | Sievers | 136/202 |
| 4,847,171 | 7/1989 | Schmatz | 429/11 |
| 4,948,679 | 8/1990 | Hunt et al. | 429/11 |
| 5,039,351 | 8/1991 | Cooper et al. | 136/202 |
| 5,089,054 | 2/1992 | Sievers | 136/202 |

OTHER PUBLICATIONS

J. D. Selle and J. H. DeVan, "The Reduction of Al$_2$O$_3$ in Niobium–Lithium Systems at 1000° C." Oak Ridge National Laboratory report ORNL/TM-5828; Chem. Abst. 88:139, 927t (1977), published Jul. 1977, pp. 1–17.

Primary Examiner—Donald P. Walsh
Assistant Examiner—Chrisman D. Carroll
Attorney, Agent, or Firm—Miguel A. Valdes; Roger S. Gaither; William R. Moser

[57] ABSTRACT

A high-voltage electrical insulator (21) for electrically insulating a thermoelectric module (17) in a spacecraft from a niobium-1% zirconium alloy wall (11) of a heat exchanger (13) filled with liquid lithium (16) while providing good thermal conductivity between the heat exchanger and the thermoelectric module. The insulator (21) has a single crystal alumina layer (SxAl$_2$O$_3$, sapphire) with a niobium foil layer (32) bonded thereto on the surface of the alumina crystal (26) facing the heat exchanger wall (11), and a molybdenum layer (31) bonded to the niobium layer (32) to act as an oxygen permeation barrier to preclude the oxygen depleting effects of the lithium from causing undesirable niobium-aluminum intermetallic layers near the alumina-niobium interface.

8 Claims, 1 Drawing Sheet

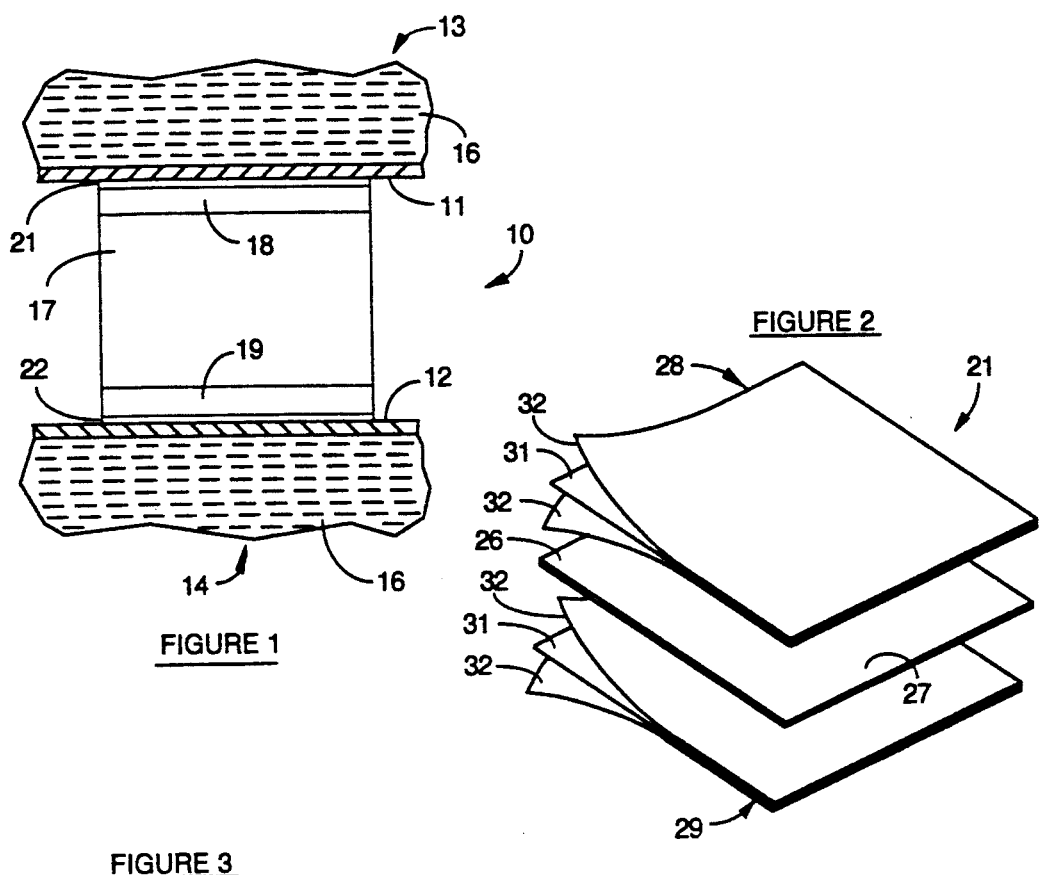
FIGURE 1
FIGURE 2
FIGURE 3
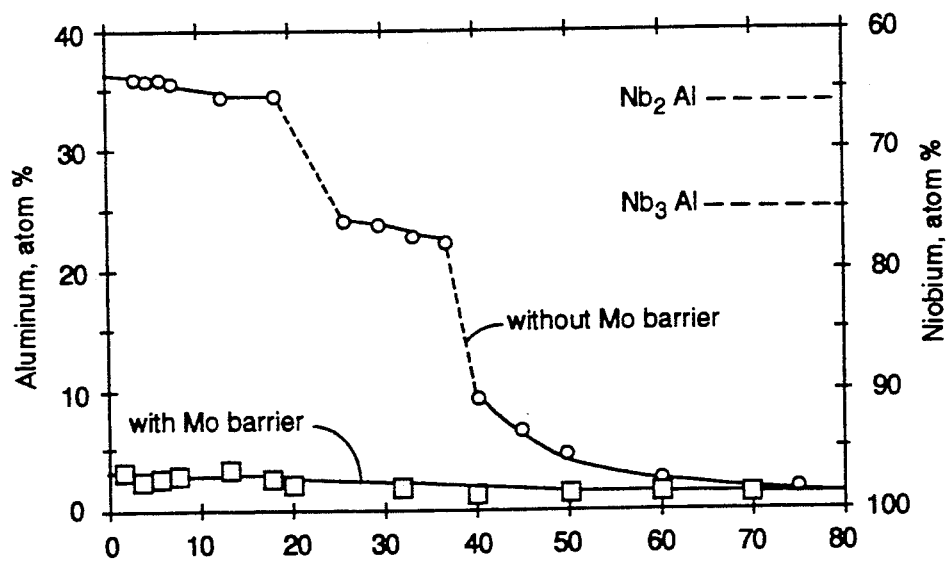
Aluminum Concentration Profiles in Niobium Facesheets

ELECTRICAL INSULATOR ASSEMBLY WITH OXYGEN PERMEATION BARRIER

STATEMENT OF GOVERNMENTAL RIGHTS

The United States Government has rights to this invention pursuant to Contract No. DE-AC03-86SF16006 between the United States Department of Energy and the General Electric Company.

BACKGROUND OF THE INVENTION

This invention relates to electrical resistors and in particular to an electrical insulator operating at high temperature, the insulator having an alumina crystal with a niobium face sheet bonded thereto and being subjected to the effects of molten lithium.

The present invention was made in connection with the development of a thermoelectric power generator for use in space vehicles. In general, the hot side of a thermoelectric cell is attached to the wall (made of Nb or Nb-1% Zr) of a heat exchanger through which molten lithium circulates in a closed loop from a nuclear reactor. The cold side of the thermoelectric cell is attached to the wall (also of Nb or Nb-1% Zr) of another heat exchanger through which liquid lithium circulates in a second closed loop to a radiator that rejects heat into space. Lithium is used in the heat exchangers because of its favorable mass, specific heat and viscosity. Its frozen condition during launch provides safety advantages. After insertion into the required orbit, the lithium distributed through the system is thawed by a heat pipe network that derives its heat from the reactor.

The nominal hot side temperature of the thermoelectric cell is approximately 1350K, and the cold side temperature is approximately 870K. Typically, the cell will develop a 100 volt potential.

The thermoelectric module of the cell must be insulated electrically from the heat exchangers which are at spacecraft ground potential, yet must be in good thermal contact with them. Accordingly, an insulator material must be placed between the thermoelectric module of the cell and the heat exchanger which has the somewhat contradictory properties of high electrical resistivity and a sufficiently high thermal conductivity so as not to represent a significant parasitic temperature drop from the heat exchanger to the thermoelectric module. Furthermore, these properties must remain stable for at least the design life, seven years, in a fairly hostile environment, at high vacuum, in temperatures up to 1350K and with voltage drops of up to 100 V applied continuously across the insulator.

In the development of a suitable insulator that would meet the above requirements, four ceramic materials were identified as having suitable promise: polycrystalline $Al_2O_3$, BeO, BN and single crystal alumina ($SxAl_2O_3$, sapphire). Of the polycrystalline materials, only BeO and BN continued to show promise. Polycrystalline $Al_2O_3$, when tested under the proposed operating conditions, demonstrated catastrophic breakdown of insulation resistance at relatively short lifetimes. BN has a low coefficient of thermal expansion, which precludes it being bonded to Nb or Nb-1% Zr. Single crystal alumina was found to be the best material. It exhibited more than sufficient electrical resistivity. Its stability with respect to either electrochemical or thermochemical degradation as judged from accelerated tests at 1573K was excellent and appeared to be adequate to enable it to serve for more than the required seven years.

The single crystal alumina insulators had a face sheet of niobium (Nb) diffusion bonded thereto, such face sheet being needed to enable the insulators to be physically attached to the wall of the heat exchanger and to provide good thermal conduction between the heat exchanger and the alumina crystal. Niobium foil was used for the face sheet because niobium can be easily and strongly bonded to sapphire and has a coefficient of thermal expansion that is very close to that of sapphire.

However, the evaluations of the single crystal alumina insulators were carried out in the absence of lithium (Li), and there was some suspicion that thermochemical degradation might occur faster when lithium was present than when it was absent. In particular, J.D. Selle and J.H. DeVan had reported in "The Reduction of $Al_2O_3$ in Niobium-Lithium Systems at 1000° C.," Oak Ridge National Laboratory report ORNL/TM-5828; Chem.Abst. 88:139, 927t (1977), published July 1977, the formation, at temperatures of the order of 1000° C. or higher, of $Nb_xAl_y$ intermetallics at the $Al_2O_3$//Nb interfaces in $Al_2O_3$ sandwich structures, where a thin layer of Nb separates $Al_2O_3$ from liquid Li. The same effect occurs if the Nb is replaced by a Nb alloy such as Nb-1% Zr.

Tests were then performed on insulator specimens in which the $Al_2O_3$ was a sapphire single crystal incorporated in either a four-layer sandwich structure, $Al_2O_3$//Nb//Nb-1% Zr//Li, with 0.13 mm thick Nb foil and 0.75 mm thick Nb-1% Zr layer, or in a five-layer sandwich, $Al_2O_3$//Nb//V//Nb-1% Zr//Li, which also included a 0.05 mm thick layer of vanadium. Tests were carried out, some at 500 hours and some at 1000 hours, at temperatures of 1373K, 1474K, and 1573K. The Selle-DeVan $Nb_xAl_y$ layers were observed in the Nb layer in all specimens.

These intermetallic layers are very undesirable in an insulator for the present purposes, because the layers have a high thermal resistance, and the brittleness of the layers can result in fractures along the layers with consequent mechanical failure of the insulator.

SUMMARY OF THE INVENTION

It is the principal object of the invention to provide a high voltage insulator with high thermal conductance and having a single crystal alumina layer with a niobium layer therein exposed to the effects of liquid lithium with means to prevent the formation of intermetallic layers of $Nb_xAl_y$ at the Nb/sapphire interface.

Additional objects, advantages and novel features will be set forth in the description which follows, and in part will become apparent to those skilled in the art upon examination of the following, or may be learned from practice of the invention. The objects and advantages of the invention may be realized and attained by means of the instrumentalities and combinations pointed out in the appended claims.

To achieve the foregoing and other objects, and in accordance with the present invention, as described and broadly claimed herein, an insulator adapted to be placed in contact with a niobium, niobium alloy, or other refractory metal container having high oxygen permeability and having liquid lithium therein is provided, the insulator having a single crystal alumina layer with a surface adapted to face towards the niobium container when the insulator is in contact therewith, a niobium layer on the surface of the alumina layer, and an oxygen permeation barrier layer covering the niobium layer, the oxygen permeation barrier having a low oxygen permeability, a high thermal conductance, a high melting point, a thermal expansion coefficient close to that of niobium and a slow interdiffusion with niobium.

A further aspect of the invention is that the oxygen permeation barrier is preferably a thin sheet of molybdenum.

BRIEF DESCRIPTION OF THE DRAWINGS

The accompanying drawings, which are incorporated in and form part of the application, together with the description, serve to explain the principles of the invention.

FIG. 1 is a sectional view illustrating a thermoelectric cell in contact with high- and low-temperature heat exchangers, the cell having a high-voltage insulator constructed in accordance with the present invention.

FIG. 2 is an exploded view of the hot-side, high voltage insulator of FIG. 1.

FIG. 3 illustrates results of using a molybdenum oxygen permeation barrier in the high-voltage insulator of FIG. 2 with respect to the prevention of niobium-aluminum intermetallic layers.

DESCRIPTION OF THE PREFERRED EMBODIMENT

Referring now to the drawings, and in particular to FIG. 1, a thermoelectric cell 10 is shown attached to the walls 11 and 12 of high-temperature and low-temperature heat exchangers 13 and 14, respectively. The walls 11 and 12 of the heat exchangers are made of niobium (Nb) or of a niobium-1% zirconium (Nb-1% Zr) alloy and the heat exchangers are filled with liquid lithium 16. The thermoelectric cell 10 includes a thermocouple module 17 with compliant pads 18 and 19 on either side thereof, a hot-side, high-voltage insulator 21 and a cold-side, high-voltage insulator 22.

The details of the thermoelectric couples array 17 and the compliant pads 18 and 19 are known and form no part of the present invention. As a consequence, such details are not illustrated on the drawings. Typically, the thermoelectric module 17 includes a plurality of thermoelectric couples, each having, for example, a positive and a negative SiGe/GaP leg interconnected together. The compliant pads 18 and 19 may be made of niobium fibers supported between thin face sheets of niobium and tungsten.

FIG. 2 shows an exploded view of the hot-side, high-voltage insulator 21 of FIG. 1. As seen in FIG. 2, the insulator comprises a 3-layer sandwich of a single crystal alumina ($Al_2O_3$, sapphire) layer 26, having an outboard surface 27 facing towards wall 11 of heat exchanger 13, and two composite face sheets 28 and 29. Each composite face sheet in turn is a 3-layer sandwich of an oxygen permeation barrier layer 31, and niobium foil layers 32 bonded onto each side of the barrier layer 31. Composite face sheets 28 and 29 are diffusion bonded to the two opposite surfaces of the sapphire crystal 26 by a conventional hot-press method.

The function of the oxygen permeation barrier 26 is to limit the rate of oxygen diffusion away from the sapphire-niobium interface such that the aluminum concentration at that point remains below the initial level for formation of $Nb_xAl_y$ intermetallics over the system's lifetime.

Qualitatively, the permeation barrier 31 must have: low oxygen permeability; high thermal conductance; a high melting point; chemical compatibility with the environment; and thermal expansion compatibility with niobium and sapphire.

Molybdenum and rhenium each combine the above desirable properties, and in addition, all have slow interdiffusion with niobium. Molybdenum also has complete solid-solid miscibility with niobium. This last property is desirable because when it exists, then no intermetallic compounds will form at the interfaces between the barrier phase and the niobium phases on either side of it.

Molybdenum (Mo) is the preferred material for the barrier layer 31. Pure molybdenum has an oxygen permeability about nine orders of magnitude lower than niobium. The lifetime of the barrier is limited by interdiffusion of the molybdenum with the niobium phases on either side of it, so that the concentration of niobium in molybdenum and the permeability to oxygen will increase with time. However, calculations show that a 0.05 mm thick barrier exceeds the requirement for seven years at maximum operation conditions.

For purposes of illustration, in a working embodiment of the invention, the molybdenum layer 31 and niobium layers 32 of face sheet 28 and 29 are each about 0.05 mm thick, while the sapphire crystal 26 is about 0.125 mm thick. The thermoelectric module 17 is about 11 mm thick, i.e., between the hot and cold sides thereof. The walls 11 and 12 of heat exchangers 13 and 14 are each typically about 0.75 mm thick.

Results of a test of an insulator with a molybdenum diffusion barrier are compared with those of an insulator without a barrier in FIG. 3. Each of the insulators was exposed to the effects of liquid lithium and was tested at 1573K for 1200 hours with 100 V impressed across the insulator. The aluminum atom concentration in the niobium layer adjacent the sapphire is plotted as a function of the distance from the sapphire-niobium interface.

As noted in FIG. 3, for the insulator without a molybdenum barrier, the aluminum concentration in niobium ranges from 36% at the interface to less than 4% at a distance of 75 $\mu$m. An $Nb_2Al$ phase occupies the region between zero and 20 $\mu$m from the sapphire surface and an $Nb_3Al$ phase occupies the region between about 20 $\mu$m to 40 $\mu$m. Beyond 40 $\mu$m is a region of niobium with aluminum in solid solution. Micrographs from a scanning electron microscope clearly show the two distinct intermetallic phases.

On the other hand, the results of the test of an insulator with a molybdenum barrier show that the barrier was very effective for 1200 hours at 1573K. As shown in FIG. 3, the aluminum concentration in the niobium face sheet bonded thereto is less than 5% in the region near the interface.

With reference to FIG. 2, the molybdenum sheet 31 and the niobium layers on each side thereof in face sheet 28 have slightly different coefficients of thermal expansion. As a result, as the temperature of the system changes during bonding or in actual service, the differences of expansion of the molybdenum and niobium layers in face sheet 28 will stress the sapphire crystal 26, tending it to become cupped in shape. For this reason, the face sheet 29 on the other side of the crystal has the same construction as that of face sheet 28, with the same materials and thicknesses, so that the stresses on both sides of the crystal 26 are equalized.

The cold-side, high-voltage insulator 22 does not require an oxygen depletion barrier in its face sheets to protect against oxygen depletion resulting from the effects of the liquid lithium in heat exchanger 14 at the relatively low temperature (i.e., about 870K) involved.

However, if the cold-side insulator 22 of the thermoelectric cell 10 is attached to the heat exchanger wall 12 by brazing, with a zirconium or titanium braze, then the face sheets of the insulator 22 should also have an oxygen permeation barrier, because zirconium and lithium have a much higher affinity for oxygen than does sapphire, and the cold-side insulator 22 will have somewhat the same problem of oxygen depletion as does the hot-side insulator 21 from the effect of the hot liquid lithium.

The foregoing description of the preferred embodiment has been presented for purposes of illustration and description. It is not intended to be exhaustive or to limit the invention to the precise form described, and obviously many other modifications are possible in light of the above teaching. The embodiment was chosen in order to explain most clearly the principles of the invention and its practical applications thereby to enable others in the art to utilize most effectively the invention in various other embodiments and with various other modifications as may be suited to the particular use contemplated. It is intended that the scope of the invention be defined by the claims appended hereto.

We claim:

1. A high voltage insulator having high thermal conductance and adapted to be placed in contact with a heat exchanger having an oxygen-permeable refractory metal container or wall with liquid lithium therein, said insulator including:

a single crystal alumina layer a surface adapted to face towards said refractory metal container when said insulator is in contact therewith, a niobium layer on said surface of said alumina layer, an oxygen permeation barrier layer covering said niobium layer, said barrier layer having a low oxygen permeability, a high thermal conductance, a high melting point, a thermal expansion coefficient close to that of niobium and a slow interdiffusion with niobium.

2. A high-voltage insulator as set forth in claim 1, wherein said barrier layer is a metal selected from the groups of molybdenum, rhenium, iridium and platinum.

3. A high-voltage insulator as set forth in claim 1, wherein said barrier layer has complete solid-solid miscibility with niobium.

4. A high-voltage insulator as set forth in claim 3, wherein said barrier layer is molybdenum.

5. A high-voltage insulator as set forth in claim 1, and further including a second niobium layer on the surface of said single crystal alumina layer which is adapted to face away from said heat exchanger when said insulator is in contact therewith, and a second oxygen permeation barrier covering said second niobium layer, both of said niobium layers having the same thickness, and both of said oxygen permeation barriers being of the same material and of the same thickness.

6. A high-voltage insulator as set forth in claim 5, wherein each of said barrier layers is a metal selected from the groups of molybdenum, rhenium, iridium and platinum.

7. A high-voltage insulator as set forth in claim 5, wherein each of said barrier layers has complete solid-solid miscibility with niobium.

8. A high-voltage insulator as set forth in claim 7, wherein each of said barrier layers is molybdenum.

* * * * *